United States Patent
Choi et al.

(10) Patent No.: US 6,320,221 B1
(45) Date of Patent: Nov. 20, 2001

(54) TFT-LCD HAVING A VERTICAL THIN FILM TRANSISTOR

(75) Inventors: Gyo Un Choi; Sung Kon Kim; Nak Hyun Sung, all of Seoul (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/473,470

(22) Filed: Dec. 28, 1999

(30) Foreign Application Priority Data

Dec. 30, 1998 (KR) .................................. 98-61867

(51) Int. Cl.⁷ .................. H01L 31/16; H01L 31/0232
(52) U.S. Cl. .................. 257/330; 257/59; 257/72; 257/329; 349/38; 349/42; 349/43
(58) Field of Search .................. 257/54–72, 329–331, 257/347; 343/89–92, 94, 98–101; 349/38, 42, 43

(56) References Cited

U.S. PATENT DOCUMENTS

| | | | |
|---|---|---|---|
| 4,996,573 | 2/1991 | Hack et al. | 257/60 |
| 5,214,296 | 5/1993 | Nakata et al. | 257/71 |
| 5,229,310 | 7/1993 | Sivan | 438/156 |
| 5,397,721 | 3/1995 | Hur | 438/156 |
| 5,668,391 | 9/1997 | Kim et al. | 257/328 |
| 5,793,082 | * 8/1998 | Bryant | 257/330 |
| 5,929,489 | * 7/1999 | Deane | 257/347 |
| 6,018,176 | * 1/2000 | Lim | 257/302 |

FOREIGN PATENT DOCUMENTS

| | | |
|---|---|---|
| 60160169 | 8/1985 | (JP) . |
| 62224976 | 10/1987 | (JP) . |
| 63296378 | 12/1988 | (JP) . |
| 1192166 | 8/1989 | (JP) . |
| 284775 | 3/1990 | (JP) . |
| 3153046 | 7/1991 | (JP) . |
| 4282865 | 10/1992 | (JP) . |
| 774360 | 3/1995 | (JP) . |
| 7297406 | 11/1995 | (JP) . |

* cited by examiner

*Primary Examiner*—Minh Loan Tran
*Assistant Examiner*—Thomas L. Dickey
(74) *Attorney, Agent, or Firm*—Selitto, Behr & Kim

(57) ABSTRACT

Disclosed is a thin film transistor liquid crystal display having a vertical thin film transistor. The thin film transistor liquid crystal display comprises: a transparent insulating substrate; a plurality of gate lines and data lines arranged on the transparent insulating substrate perpendicular to each other, wherein the gate line comprises a recess at a portion toward a corresponding pixel area; a pixel electrode disposed within a pixel area defined by a pair of gate lines and a pair of data lines, wherein the pixel electrode comprises a protrusion disposed within the recess without contacting the gate line; and a thin film transistor disposed at a portion of intersection of the gate line and the data line, wherein the thin film transistor comprises a gate electrode including the recess; a protrusion of the pixel electrode functioning as a source electrode; a first ohmic contact layer, a semiconductor layer and a second ohmic contact layer all stacked on the protrusion; and a drain electrode withdrawn from the data line and disposed on the second ohmic contact layer, wherein channel regions in the semiconductor layer are formed in a vertical direction at each portion adjacent to the gate electrode.

2 Claims, 5 Drawing Sheets

TFT-LCD HAVING A VERTICAL THIN FILM TRANSISTOR

BACKGROUND OF THE INVENTION

1. Field of the Invention

The present invention relates to a thin film transistor liquid crystal display(hereinafter "TFT-LCD"), and more particularly to a TFT-LCD having a vertical thin film transistor.

2. Description of the Related Art

Liquid crystal displays used in television and other graphic display devices have been developed for substituting the cathode ray tube("CRT"). Particularly, the TFT-LCD has an advantage of excellent response characteristic and is appropriate for high number of pixels. Therefore, high quality and large size of display devices comparable to the CRT, is realized.

The TFT-LCD comprises a TFT array substrate in which a TFT and a pixel electrode are formed, a color filter substrate in which a color filter and a counter electrode are formed, and a liquid crystal layer sandwiched between the TFT array substrate and the color filter substrate.

FIG. 1 is a plane view showing a TFT array substrate of a conventional TFT-LCD. As shown in the drawing, a plurality of gate lines 2 are arranged in rows and a plurality of data lines 8 are arranged perpendicular to the gate lines 2. A pixel electrode 7 made of transparent metal layer, for example an ITO metal layer, is disposed within a pixel area defined by a pair of gate lines 2 and a pair of data lines 8. A TFT 10 is disposed at a portion of intersection of the gate line 2 and the data line 8. The TFT 10 includes a gate electrode, i.e. a part of the gate line 2, a drain electrode 8b withdrawn from the data line 8, and a source electrode 8a opposed to the drain electrode 8b and in contact with the pixel electrode 7.

FIG. 2 is a cross-sectional view taken along the line II–II' of FIG. 1. As shown in the drawing, a transparent insulating substrate, for example a glass substrate 1 is provided and a gate electrode 2a is formed on the glass substrate 1. A gate insulating layer 3 is deposited on the glass substrate 1 to cover the gate electrode 2a, and an etch stopper 4 is formed on the gate insulating layer portion of an upper portion of the gate electrode 2a.

A semiconductor layer 5 and an ohmic contact layer 6 of a stacked structure are formed to extend at both sides of the etch stopper 4. The semiconductor layer 5 is made of an undoped amorphous silicon and the ohmic contact layer 6 is made of a doped amorphous silicon. A pixel electrode 7 is formed on the gate insulating layer portion corresponding to the pixel area. Source and drain electrodes 8a, 8b made of an opaque metal are formed on the ohmic contact layer 5, thereby forming a TFT 10. The source electrode 8a is formed in contact with the pixel electrode 7.

The TFT-LCD having the TFT array substrate of the foregoing structure has shortcomings as follows.

First of all, the semiconductor layer of the TFT is made of the undoped amorphous silicon as previously described. However, since the amorphous silicon has low mobility, it is suitable for applying in the small size TFT-LCD, and it is not suitable for applying in the large size and high quality TFT-LCD. Meanwhile, a technique to use polysilicon having relatively high mobility instead the amorphous silicon, has been under development. However, in order to utilize this technique, already established production line should be changed thereby requiring further cost for investing the equipment.

Next, the source and the drain electrodes of the TFT are formed within the pixel area. However, since the source and the drain electrodes made of an opaque metal, the aperture ratio is degraded.

SUMMARY OF THE INVENTION

Accordingly, the object of the present invention is to provide a TFT-LCD having a vertical TFT capable of obtaining enhanced aperture ratio and suitable for the manufacturing of large size and high quality display device.

To accomplish the object, the TFT-LCD of the present invention comprises: a transparent insulating substrate; a plurality of gate lines and data lines arranged on the transparent insulating substrate perpendicular to each other, wherein the gate line comprises a recess at a portion toward a corresponding pixel area; a pixel electrode disposed within a pixel area defined by a pair of gate lines and a pair of data lines, wherein the pixel electrode comprises a protrusion disposed within the recess without contacting the gate line; and a thin film transistor disposed at a portion of intersection of the gate line and the data line, wherein the thin film transistor comprises a gate electrode including the recess; a protrusion of the pixel electrode functioning as a source electrode; a first ohmic contact layer, a semiconductor layer and a second ohmic contact layer all stacked on the protrusion; and a drain electrode withdrawn from the data line and disposed on the second ohmic contact layer, wherein channel regions in the semiconductor layer are formed in a vertical direction at each portion adjacent to the gate electrode.

BRIEF DESCRIPTION OF THE DRAWINGS

The above object and features of the invention will more fully be apparent from the following detailed description with accompanying description with accompanying drawings.

DETAILED DESCRIPTION OF THE INVENTION

Figure 1:
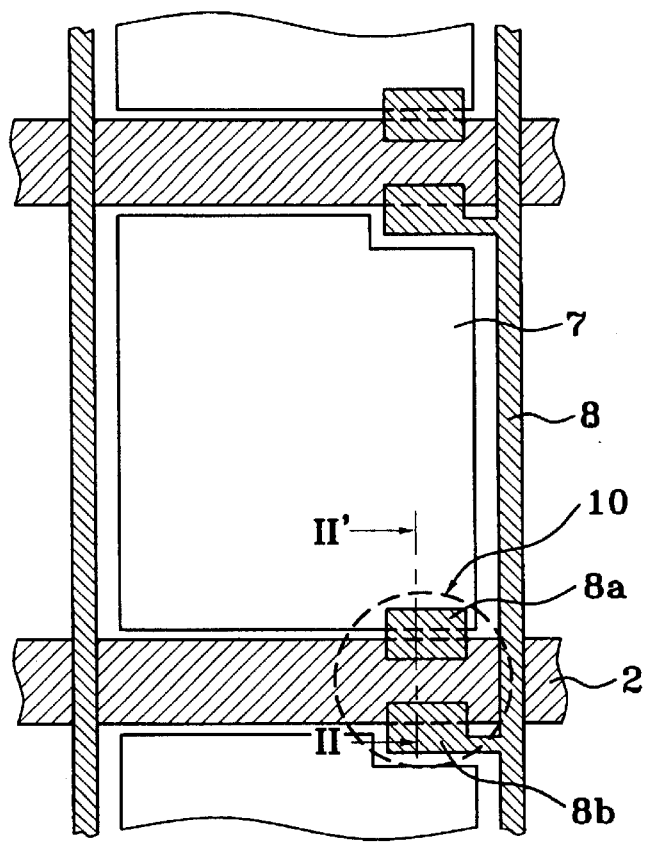
FIG. 1 is lane view showing a TFT array substrate according to a conventional TFT-LCD.
Figure 2:
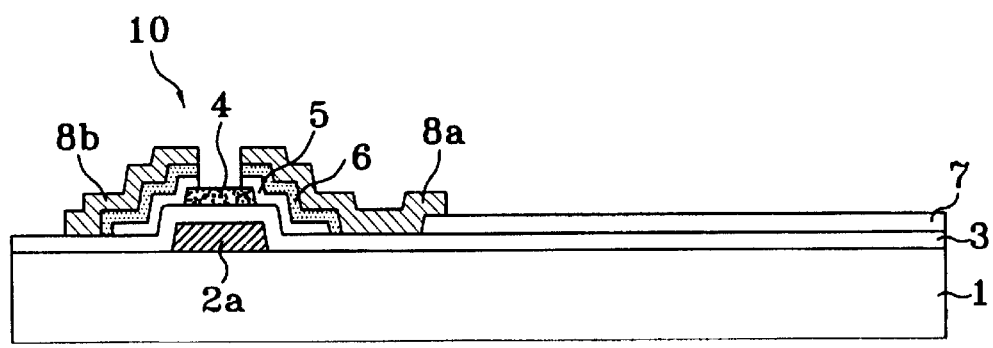
FIG. 2 is a cross-sectional view taken along the line II–II' of FIG. 1.
Figure 3:
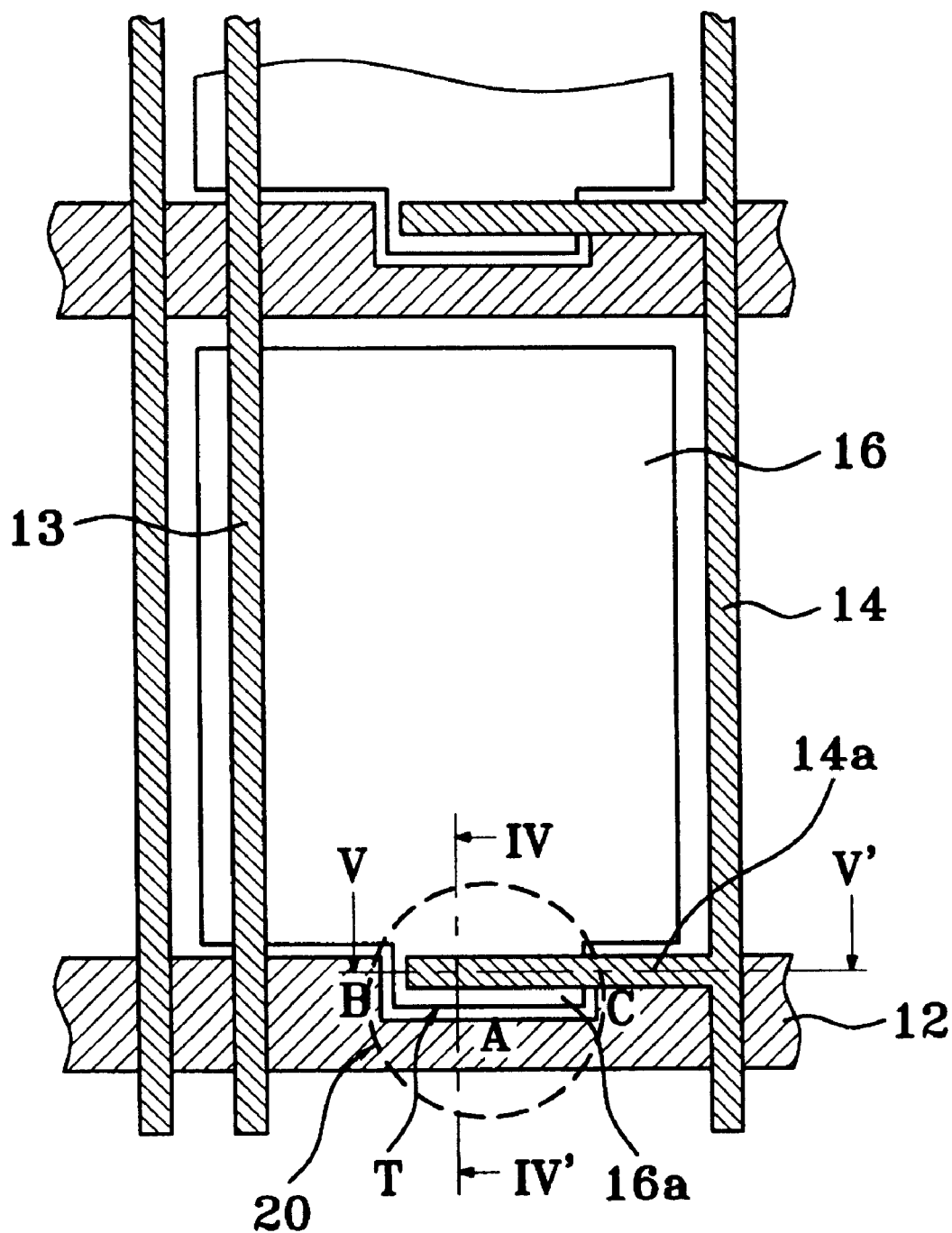
FIG. 3 is a plane view showing a TFT array substrate of a TFT-LCD having a vertical TFT according to the present invention.

Referring to FIG. 3, gate lines 12 are arranged in rows and data lines 14 are arranged perpendicular to the gate lines 12. A pixel electrode 16 made of a transparent metal layer, such as ITO is formed within a pixel area defined by the gate line 12 and the data line 14. Herein, the gate line 12 has a recess T at a portion toward the pixel area, and a pixel electrode 16 has a protrusion 16a disposed within the recess T, without contacting with the gate line 12. A storage line 13 is arranged parallel with the data line 14 and perpendicular to the gate line 12.

A vertical TFT 20 is disposed at a portion of intersection of the gate line 12 and the data line 14. The vertical TFT 20 includes a part of the gate line 12 i.e. a gate electrode having a recess T, a protrusion 16a of the pixel electrode 16 functioning as a source electrode, and a drain electrode 14a that is withdrawn from the data line 14 in parallel with the gate line 12 and an end thereof is disposed on the protrusion 16a of the pixel electrode 16.

Reference symbols A, B and C mean the regions where channel regions are formed. In the conventional TFT, one channel region is formed therein. However, there are formed three channel regions in the vertical TFT 20 of the embodiment of the present invention since the vertical TFT 20 is formed within the recess T of the gate line 12.

Figure 4:
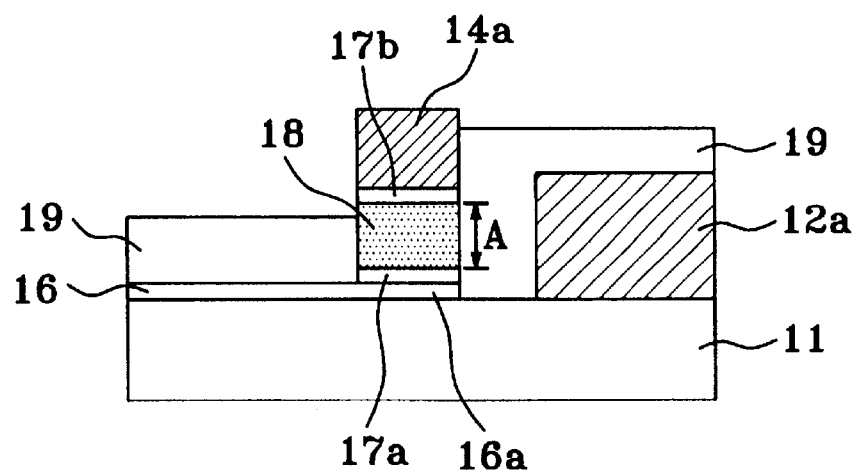
FIG. 4 is a cross-sectional view taken along the line IV–IV' of FIG. 3.
Figure 5:
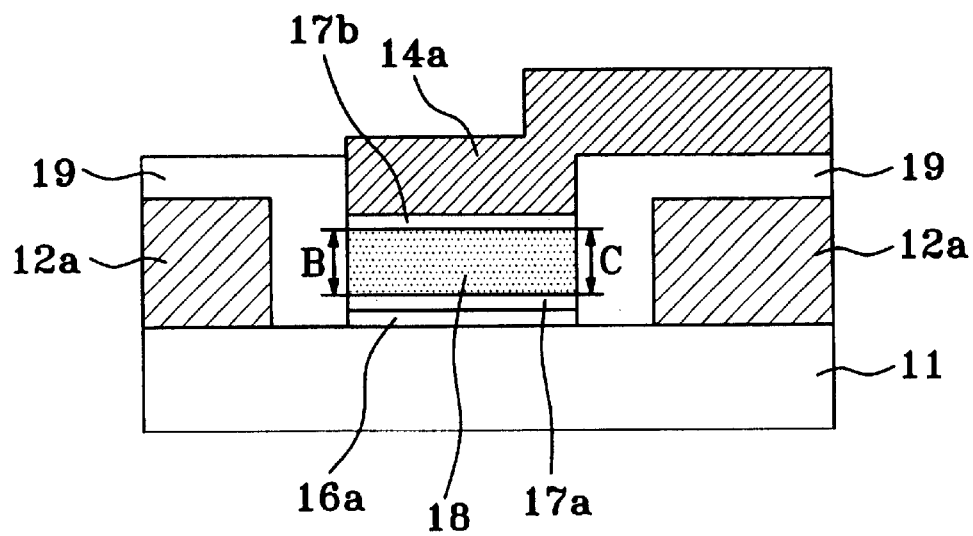
FIG. 5 is a cross-sectional view taken along the line V–V' of FIG. 3.

In details, referring to FIGS. 4 and 5, the vertical TFT 20 includes: a part of the gate line 12 i.e. the gate electrode 12a; a protrusion 16a of the pixel electrode disposed without contacting the gate electrode 12a and functioning as a source electrode; a gate insulating layer 19 formed to insulate the gate electrode 12a and the protrusion 16a; a first ohmic contact layer 17a, a semiconductor layer 18 and a second ohmic contact layer 17b all stacked on the protrusion 16a; and a drain electrode 15 formed on the second ohmic contact layer 17b. The reference numeral 11 means a glass substrate. Herein, the overall thickness of the first ohmic contact layer 17a, the semiconductor layer 18 and the second ohmic contact layer 17b is equal to or thinner than that of the gate electrode 12a. Further, the thickness of the gate insulating layer 19 is selected such that a channel is formed in the semiconductor layer 18.

A first channel region A, as shown in FIG. 4, is formed in a vertical direction at the semiconductor layer portion adjacent to the gate electrode 12a. A second channel region B and a third channel region C, as shown in FIG. 5, are formed in the vertical direction at the semiconductor layer portions adjacent to the gate electrode 12a, respectively.

Figure 6A:
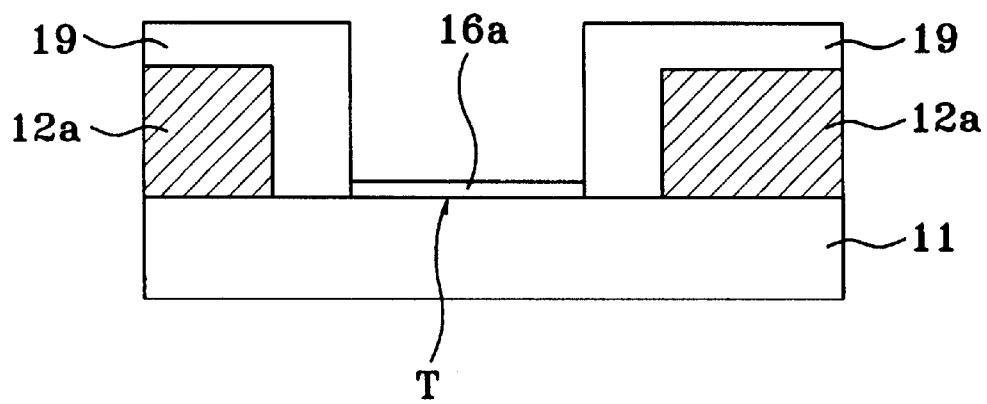
FIGS. 6A to 6C are cross-sectional views taken along the line V–V' of FIG. 3 for illustrating the forming of the vertical TFT according to an embodiment of the present invention.
Figure 6B:
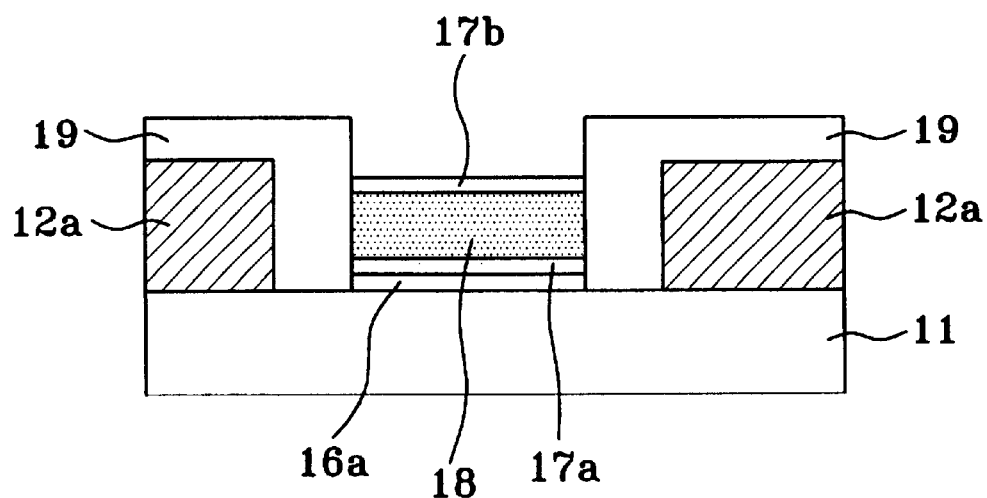
Figure 6C:
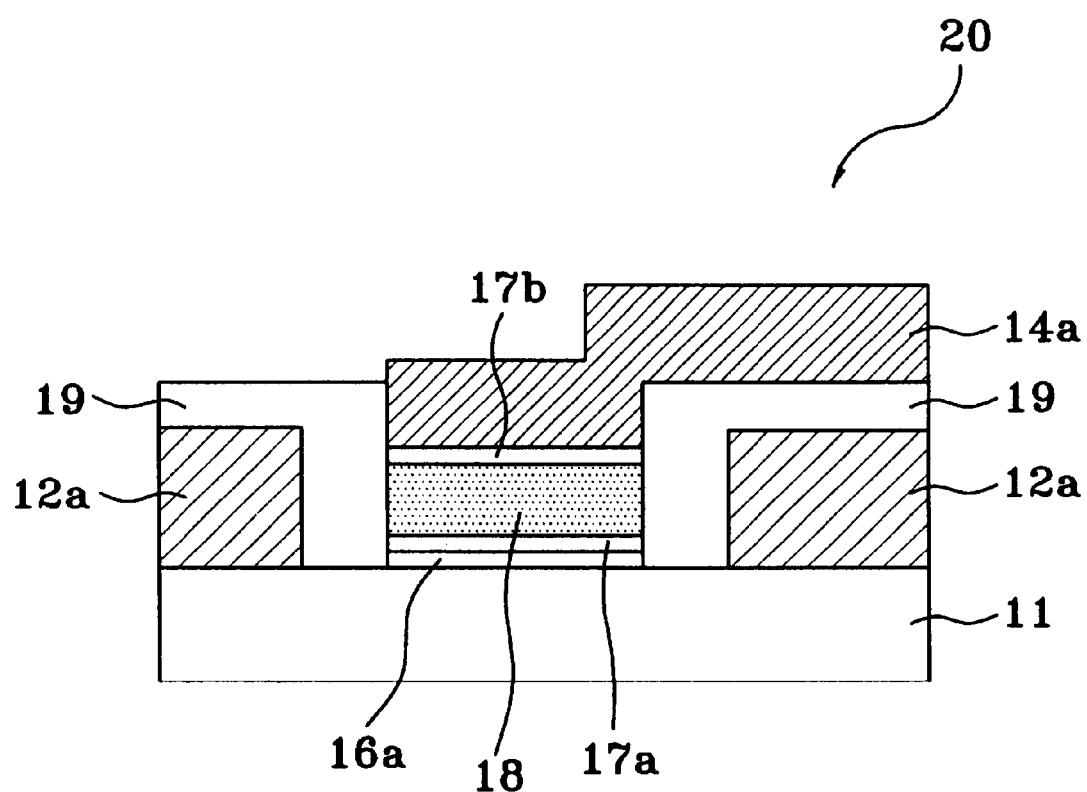

FIGS. 6A to 6C are cross-sectional views taken along the line V–V' of FIG. 3 for illustrating the forming of the vertical TFT according to an embodiment of the present invention.

Referring to FIG. 6A, a transparent insulating layer, for example a glass substrate 11 is provided, and a gate line having the recess T(hereinafter, a gate electrode 12a) is formed on the glass substrate 11. A pixel electrode having a protrusion 16a is formed within the recess T without contacting the gate electrode 12a. The protrusion 16a functions as a source electrode. A gate insulating layer 19 is formed between the gate electrode 12a and the protrusion 16a and on the gate electrode 12a so as to insulate the gate electrode 12a and the protrusion 16a.

Referring to FIG. 6B, a stacked pattern of a first ohmic contact layer 17a, a semiconductor layer 18 and a second ohmic contact layer 17b, is formed on the protrusion 16a with a thickness equal to or thinner than that of the gate electrode 12a.

Referring to FIG. 6C, a drain electrode 14a is formed on the second ohmic contact layer 17b thereby completing a vertical TFT 20.

In the embodiment of the present invention, the vertical TFT has three channel regions at the semiconductor layer thereof. Therefore, although amorphous silicon is used as a material for the semiconductor layer, enhanced mobility can be obtained. Accordingly, large size and high quality TFT-LCD is realized by using the amorphous silicon for the semiconductor layer rather than the polysilicon. Also, no further cost for investing the equipment is required.

Furthermore, since the vertical TFT of the embodiment of the present invention is formed in the vertical direction, a line width of the semiconductor layer is reduced, so that the size of TFT itself is also reduced. Accordingly, the entire size of TFT in the pixel area is reduced, thereby realizing the TFT-LCD having enhanced aperture ratio.

Moreover, a region obtained by the reduction in the TFT size can be utilized as a display area, which contributes to the manufacturing of the large size TFT-LCD.

While the present invention has been described with reference to certain preferred embodiments, various other modifications will be apparent to and can be readily made by those skilled in the art without departing from the scope and spirit of the present invention.

What is claimed is:

1. A thin film transistor liquid crystal display comprising:
   a transparent insulating substrate;
   a plurality of gate lines and data lines arranged on the transparent insulating substrate perpendicular to each other, wherein at least one of the gate lines comprises a recess at a portion toward a corresponding pixel area;
   a pixel electrode disposed within the pixel area defined by a pair of the gate lines and a pair of the data lines, wherein the pixel electrode comprises a protrusion disposed within the recess without contacting a corresponding one of the gate lines;
   a thin film transistor disposed at a portion of an intersection of the corresponding one of the gate lines and a corresponding one of the data lines, wherein the thin film transistor comprises a gate electrode including the recess; the protrusion of the pixel electrode functioning as a source electrode; a first ohmic contact layer, a semiconductor layer and a second ohmic contact layer all stacked on the protrusion; and a drain electrode withdrawn from the corresponding one of the data lines and disposed on the second ohmic contact layer, wherein channel regions in the semiconductor layer are formed in a vertical direction at each portion adjacent to the gate electrode; and
   storage lines arranged perpendicular to the gate lines and separated from the data lines.

2. The thin film transistor liquid crystal display of claim 1, wherein the overall thickness of the first ohmic contact layer, the semiconductor layer and the second ohmic contact layer, is equal to or thinner than that of the gate electrode.

* * * * *